(12) United States Patent
Jeon et al.

(10) Patent No.: US 8,509,373 B2
(45) Date of Patent: Aug. 13, 2013

(54) APPARATUS AND METHOD FOR GENERATING SMALL-SIZE SPREAD SPECTRUM CLOCK SIGNAL

(75) Inventors: Ha-Jun Jeon, Seongnam-si (KR); Sang-Seob Kim, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 861 days.

(21) Appl. No.: 12/635,553

(22) Filed: Dec. 10, 2009

(65) Prior Publication Data

US 2010/0166039 A1    Jul. 1, 2010

(30) Foreign Application Priority Data

Dec. 29, 2008    (KR) .................. 10-2008-0136091

(51) Int. Cl.
*H03D 3/24*    (2006.01)

(52) U.S. Cl.
USPC ............................ 375/376; 375/373

(58) Field of Classification Search
USPC ............ 375/376, 373, 130, 294; 331/1 A, 331/16; 327/156, 165, 295, 296; 455/103, 455/127, 307, 325
See application file for complete search history.

(56) References Cited

U.S. PATENT DOCUMENTS

| | | | | |
|---|---|---|---|---|
| 7,859,345 | B2 * | 12/2010 | Kawamoto | 331/17 |
| 2003/0058053 | A1 * | 3/2003 | Jeon et al. | 331/17 |
| 2005/0168290 | A1 * | 8/2005 | Parikh | 331/16 |
| 2006/0290393 | A1 * | 12/2006 | Yamamoto et al. | 327/156 |

* cited by examiner

*Primary Examiner* — Khai Tran
(74) *Attorney, Agent, or Firm* — Sherr & Jiang, PLLC

(57) ABSTRACT

An apparatus and method for generating a small-size spread spectrum clock signal that can include generating a reference clock signal by dividing an external clock signal, detecting frequency and phase differences between a reference clock signal and a comparison clock signal as error signals, modulating a controlled voltage corresponding to the current in accordance with a modulation control signal, outputting an oscillation clock signal having a frequency oscillated according to the modulated controlled voltage as a spectrum-spread version of the external clock signal, and generating the comparison clock signal by dividing the oscillation clock signal, and then compensating for the modulation of the controlled voltage in accordance with a demodulation magnitude that is generated for use in compensating for the modulation magnitude.

20 Claims, 4 Drawing Sheets

APPARATUS AND METHOD FOR GENERATING SMALL-SIZE SPREAD SPECTRUM CLOCK SIGNAL

The present application claims priority under 35 U.S.C. §119 to Korean Patent Application No. 10-2008-0136091 (filed on Dec. 29, 2008), which is hereby incorporated by reference in its entirety.

BACKGROUND

Due to the trend of high-speed digital systems attributed to technological developments, Electro-Magnetic Interference (EMI) has emerged as a challenging issue to tackle. To mitigate EMI, an EMI filter was used or EMI shielding was applied in an initial stage. However, the use of an EMI filer or the EMI shielding is not cost-effective and has technical limitations. That's why a Spread Spectrum Clock Generator (SSCG) has been widespread recently. For EMI reduction, the SSCG modulates a reference signal with a high energy in a specific frequency to a signal with a low energy relative to the reference signal in a frequency having a predetermined bandwidth. As a clock signal is spread across a specific frequency band by the SSCG, rather than it is fixed to a specific frequency, the energy of the clock signal in the specific frequency is distributed and thus the clock signal does not cause EMI to adjacent electronic circuits.

Figure 1:
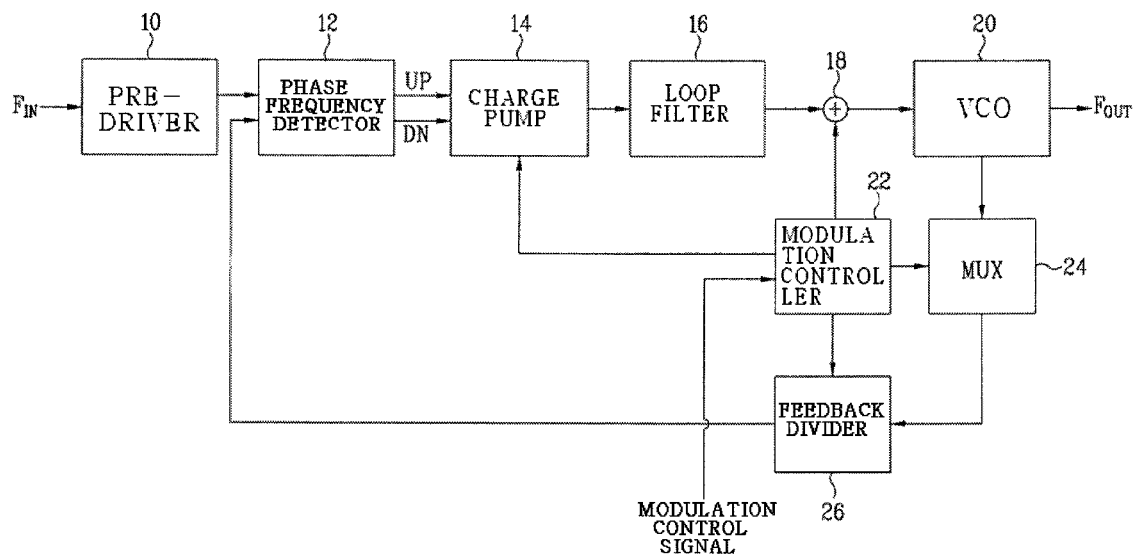

FIG. 1 is a block diagram of an SSCG that includes a pre-divider 10, a phase frequency detector 12, a charge pump 14, a loop filter 16, a combiner 18, a Voltage Controlled Oscillator (VCO) 20, a modulation controller 22, a Multiplexer (MUX) 24, and a feedback divider 26. The phase frequency detector 12, the charge pump 14, the loop filter 16, the VCO 20, and the feedback divider 26 collectively form a typical Phase Locked Loop (PLL).

The SSCG illustrated in FIG. 1 has blocks used for modulation in the PLL in order to carry out a spread spectrum function. The spectrum spreading can be achieved largely in the following four methods. One method is a fine control of the feedback divider 26 through the modulation controller 22. A second spectrum spreading method is to apply a modulation voltage directly to the loop filter 16 through the modulation controller 22. The modulation voltage is combined with the output of the loop filter 16 in the combiner 18. A third spectrum spreading method is to provide modulation information to the charge pump 14 through the modulation controller 22. A fourth spectrum spreading method is to control the output phase of the VCO 20 through the modulation controller 22 and the MUX 24. The modulation controller 22 generates a selection signal for the MUX 24.

The SSCG using the foregoing methods should transmit a typical modulation frequency ranging from tens of kHz to hundreds of kHz without distortion. The bandwidth of the PLL should be set to be low, such as about a tenth of the modulation frequency, e.g., ranging from several kHz to tens of kHz.

As the modulation frequency gets lower, the PLL bandwidth should be decreased. As a result, the capacitance of the loop filter 16 should be increased to or above several nF. It is difficult to integrate such a capacitor having a capacitance of several nF on a chip. For this reason, most spread spectrum PLLs adopt external filters. The use of additional parts increases cost.

SUMMARY

Embodiments relate to an apparatus and method for generating a clock signal, and more particularly, to an apparatus and method for generating a small-size spread spectrum clock signal.

Embodiments relate to an apparatus and method for generating a small-size spread spectrum clock signal, in which a loop filter is rendered independent of a modulation frequency by compensating for modulation of a voltage of the loop filter and applying modulation only to the output of a voltage controlled oscillator.

In accordance with embodiments, a small-size spread spectrum clock generator may include at least one of the following: a pre-divider for generating a reference clock signal by dividing an external clock signal; a phase frequency detector for detecting frequency and phase differences between the reference clock signal and a comparison clock signal and outputting the detected frequency and phase differences as error signals; a charge pump for outputting current according to the error signals; a loop filter for outputting a controlled voltage corresponding to the current received from the charge pump; a modulation controller for generating a modulation magnitude according to a modulation control signal; a modulator for modulating the controlled voltage according to the modulation magnitude; a voltage controlled oscillator for outputting an oscillation clock signal having a frequency oscillated according to the modulated controlled voltage as a spectrum-spread version of the external clock signal, a feedback divider for generating the comparison clock signal by dividing the oscillation clock signal; a demodulation controller for generating a demodulation magnitude for use in compensating for the modulation magnitude; and a demodulator for compensating for the modulation of the controlled voltage output from the loop filter according to the demodulation magnitude.

In accordance with embodiments, a method for generating a small-size spread spectrum clock signal can include at least one of the following: generating a reference clock signal by dividing an external clock signal; detecting frequency and phase differences between a reference clock signal and a comparison clock signal as error signals; modulating a controlled voltage corresponding to the current according to a modulation control signal; outputting an oscillation clock signal having a frequency oscillated according to the modulated controlled voltage as a spectrum-spread version of the external clock signal; generating the comparison clock signal by dividing the oscillation clock signal; and then compensating for the modulation of the controlled voltage according to a demodulation magnitude that is generated for use in compensating for the modulation magnitude.

In accordance with embodiments, a method for generating a small-size spread spectrum clock signal can include at least one of the following: generating a reference clock signal by dividing an external clock signal; detecting frequency and phase differences between the reference clock signal and a comparison clock signal and then outputting the detected frequency and phase differences as error signals; outputting current in accordance with the error signals; outputting a controlled voltage corresponding to the current; generating a modulation magnitude in accordance with a modulation control signal; modulating the controlled voltage in accordance with the modulation magnitude; outputting an oscillation clock signal having a frequency oscillated in accordance with the modulated controlled voltage as a spectrum-spread version of the external clock signal; generating the comparison clock signal by dividing the oscillation clock signal; generating a demodulation magnitude for use in compensating for the modulation magnitude; and then compensating for the modulation of the controlled voltage in accordance with the demodulation magnitude.

DRAWINGS

FIG. 1 illustrates a Spread Spectrum Clock Generator (SSCG).

Example FIGS. 2 to 7 illustrate small-size SSCGs, in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

With reference to FIGS. 2 to 6, the configurations and operations of small-size Spread Spectrum Clock Generators (SSCGs) in accordance with embodiments will be described below.

Example FIGS. 2 to 6 are block diagrams of small-size SSCGs in accordance with embodiments.

Figure 2:
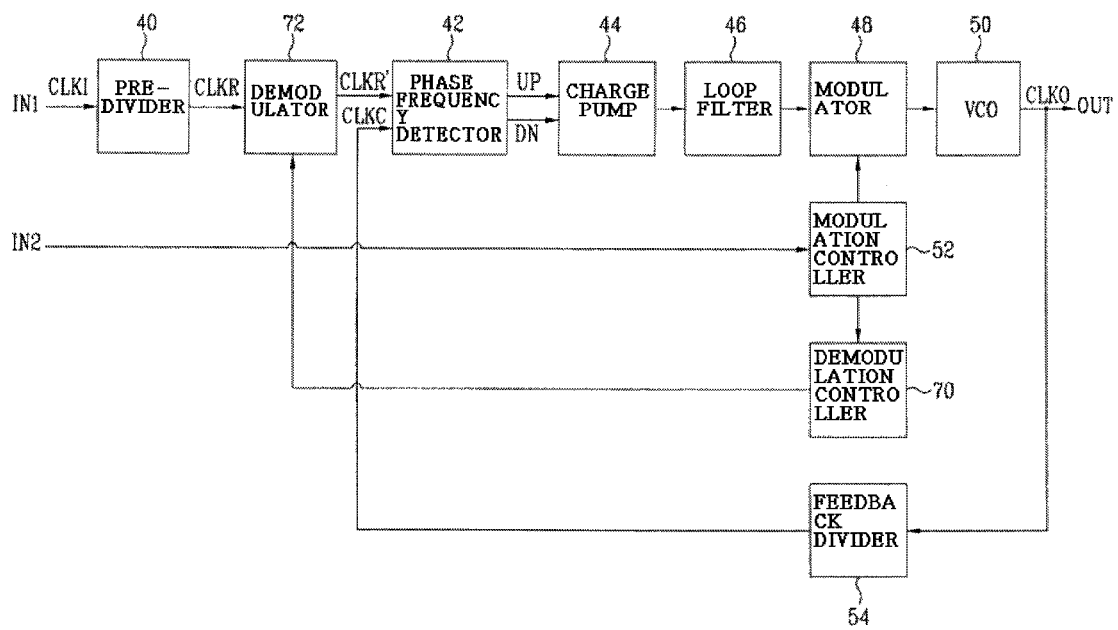

As illustrated in example FIG. 2, a small-size SSCG in accordance with embodiments includes a pre-divider 40, a phase frequency detector 42, a charge pump 44, a loop filter 46, a modulator 48, a Voltage Controlled Oscillator (VCO) 50, a modulation controller 52, a feedback divider 54, a demodulation controller 70, and a demodulator 72.

Figure 3:
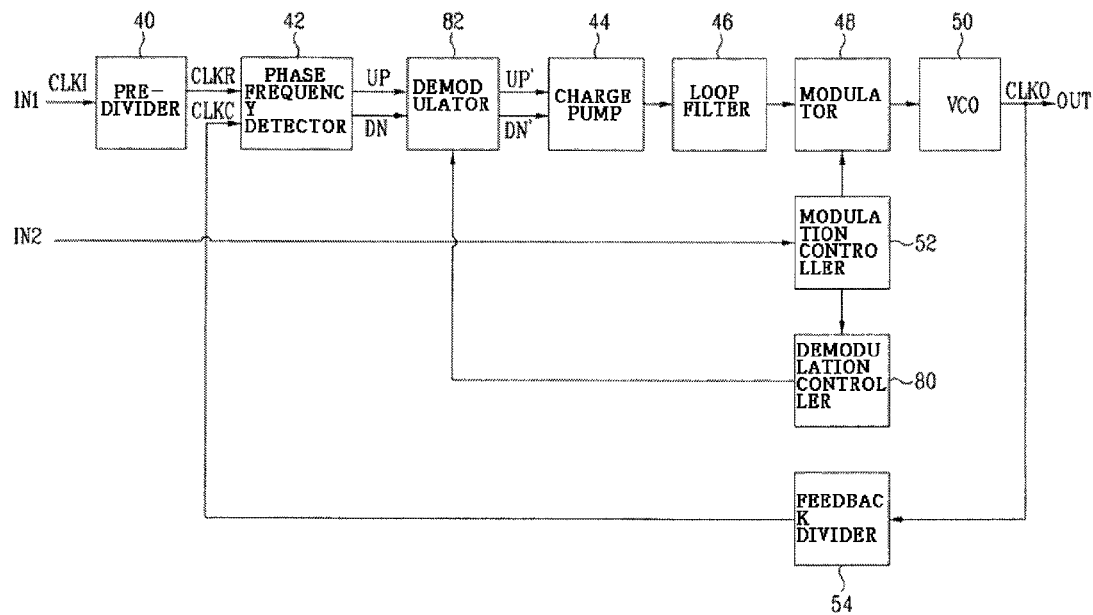

As illustrated in example FIG. 3, a small-size SSCG in accordance with embodiments includes the pre-divider 40, the phase frequency detector 42, the charge pump 44, the loop filter 46, the modulator 48, the VCO 50, the modulation controller 52, the feedback divider 54, a demodulation controller 80, and a demodulator 82.

Figure 4:
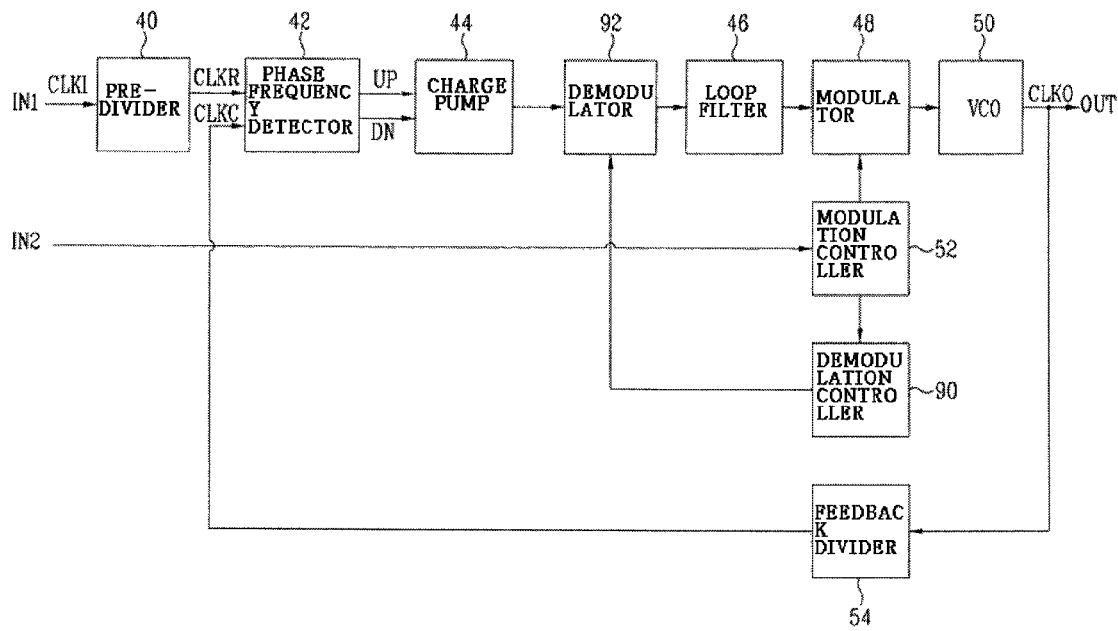

As illustrated in example FIG. 4, a small-size SSCG in accordance with embodiments includes the pre-divider 40, the phase frequency detector 42, the charge pump 44, the loop filter 46, the modulator 48, the VCO 50, the modulation controller 52, the feedback divider 54, a demodulation controller 90, and a demodulator 92.

Figure 5:
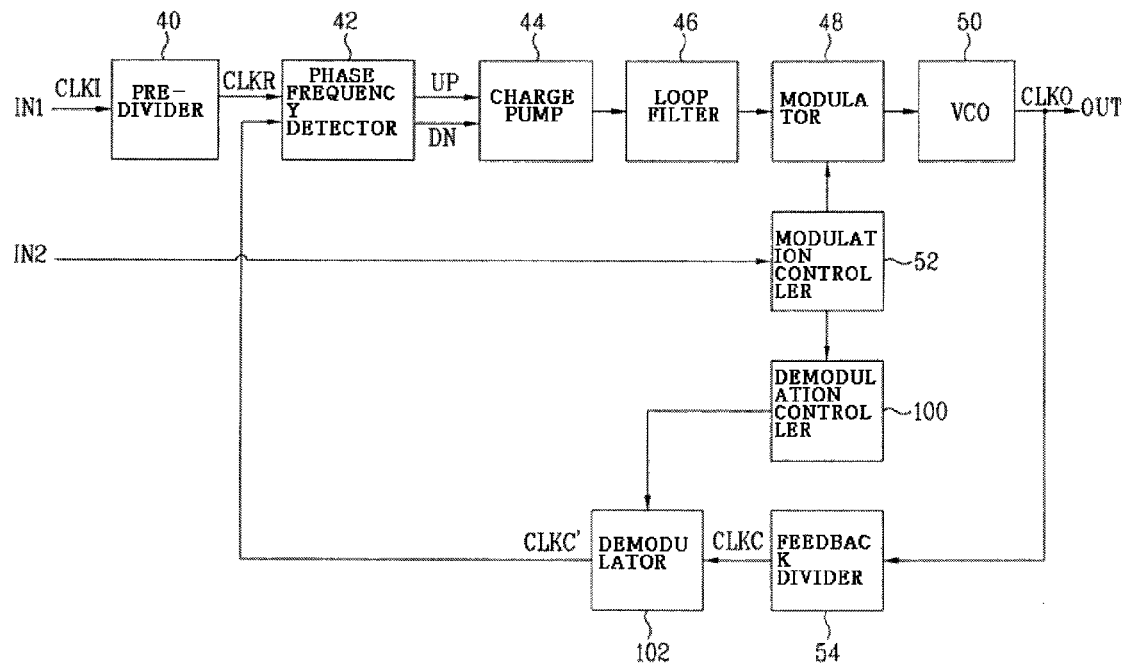

As illustrated in example FIG. 5, a small-size SSCG in accordance with embodiments includes the pre-divider 40, the phase frequency detector 42, the charge pump 44, the loop filter 46, the modulator 48, the VCO 50, the modulation controller 52, the feedback divider 54, a demodulation controller 100, and a demodulator 102.

Figure 6:
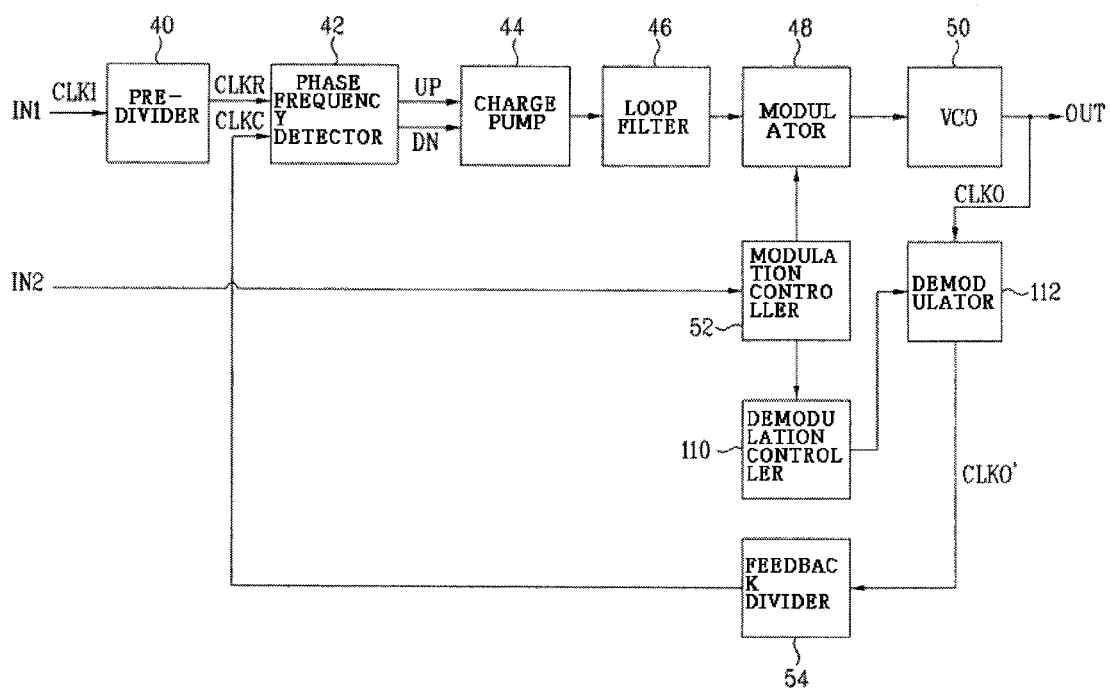

As illustrated in example FIG. 6, a small-size SSCG in accordance with embodiments includes the pre-divider 40, the phase frequency detector 42, the charge pump 44, the loop filter 46, the modulator 48, the VCO 50, the modulation controller 52, the feedback divider 54, a demodulation controller 110, and a demodulator 112.

Components common to the small-size SSCGs illustrated in example FIGS. 2 to 6 will be described below.

The pre-divider 40 divides the frequency of an external clock signal CLKI received through an input port IN1 by M (1/M frequency division) and outputs a frequency-division result as a reference clock signal CLKR. For example, M is a positive integer. The phase frequency detector 42 detects frequency and phase differences between the reference clock signal and a comparison clock signal and outputs the frequency and phase differences as error signals UP and DN to the charge pump 44. For instance, the phase frequency detector 42 may detect a rising edge difference between the reference clock signal and the comparison clock signal and output phase difference signals UP and DN having a pulse width corresponding to the detection result as error signals.

The charge pump 44 outputs current to the loop filter 46 according to the error signals UP and DN. For example, the charge pump 44 may supply a positive current (source current) to the loop filter 46 in response to the error signal UP and a negative current (sink current) to the loop filter 46 in response to the error signal DN. The loop filter 46 outputs a controlled voltage CV to the modulator 48 in correspondence with the current received from the charge pump 44. Meaning, the loop filter 46 integrates the current received from the charge pump 44 and outputs the integrated result as the controlled voltage CV. The loop filter 46 is a Low Pass Filter (LPF), which may be configured with a resistor and a capacitor. The configuration of an LPF with a resistor and a capacitor may be one of a general type and thus, its detailed description will not be provided herein.

The modulation controller 52 generates a modulation magnitude, namely a modulation voltage, corresponding to a modulation control signal received through an input port IN2. The modulator 48 modulates the controlled voltage CV according to the modulation magnitude received from the modulation controller 52 and outputs the modulation result to the VCO 50. For instance, the modulator 48 may add the modulation voltage to the controlled voltage CV and output the sum as a modulated controlled voltage. The VCO 50 receives the modulated controlled voltage from the modulator 48 and outputs an oscillation clock signal CLKO having a frequency oscillated according to the modulated control signal as a spectrum-spread version of the external clock signal through an output port OUT.

The feedback divider 54 divides the oscillation clock signal CLKO and outputs a divided oscillation clock signal as the comparison clock signal. Each of the demodulation controllers 70, 80, 90, 100 and 110 illustrated in example FIGS. 2 to 6 generates a demodulation magnitude with which to compensate for the modulation magnitude output from the modulation controller 52 and outputs the demodulation magnitude to the demodulator 72, 82, 92, 102 or 112. Each of the demodulators 72, 82, 92, 102 and 112 serves to compensate for the modulation of the controlled voltage CV output from the loop filter 46 according to the demodulation magnitude received from the demodulation controller 70, 80, 90, 100 or 110.

The configurations of the demodulators 72, 82, 92, 102 and 112 may be variable in accordance with modulation schemes, as follows. In accordance with embodiments, the demodulator 72 illustrated in example FIG. 2 compensates for the phase variation of the reference clock signal CLKR resulting from the division in the pre-divider 40 by as much as a modulation magnitude corresponding to the demodulation magnitude received from the demodulation controller 70 and outputs the compensated reference clock signal CLKR' to the phase frequency detector 42. In this case, the phase frequency detector 42 detects frequency and phase differences between the reference clock signal CLKR' received from the demodulator 72 with the comparison clock signal CLKC received from the feedback divider 54 and outputs the frequency and phase differences as the error signals UP and DN to the charge pump 44. For this purpose, the demodulator 72 may be incorporated into the pre-divider 40.

In accordance with embodiments, the demodulator 82 illustrated in example FIG. 3 compensates for the pulse width of the error signals UP and DN received from the phase frequency detector 42 by as much as a modulation magnitude corresponding to the demodulation magnitude received from the demodulation controller 80 and outputs the compensated error signals UP' and DN' to the charge pump 44. In this case, the charge pump 44 outputs current corresponding to the compensated error signals UP' and DN' to the loop filter 46. For this purpose, the demodulator 82 may be incorporated into the phase frequency detector 42.

In accordance with embodiments, the demodulator 92 illustrated in example FIG. 4 compensates for the magnitude of the current received from the charge pump 44 by as much as a modulation magnitude corresponding to a demodulation magnitude received from the demodulation controller 90 and outputs the compensated current to the loop filter 46. In this case, the loop filter 46 outputs a controlled voltage CV to the modulator 48 in correspondence with the current received from the demodulator 92. For this purpose, the demodulator 92 may be incorporated into the charge pump 44. In the case where the small-size SSCG illustrated in example FIG. 4 adopts a method for directly modulating the controlled voltage CV generated from the loop filter 46 as described above, the output current of the charge pump 44 is adjusted such that the modulation of the controlled voltage CV may be compensated for.

In accordance with embodiments, the demodulator 102 illustrated in example FIG. 5 compensates the phase variation of the comparison clock signal CLKC resulting from the division in the feedback divider 54 by as much as a modulation magnitude corresponding to the demodulation magnitude received from the demodulation controller 100 and outputs the compensated comparison clock signal CLKC' to the phase frequency detector 42. The phase frequency detector 42 detects frequency and phase differences between the reference clock signal CLKR and the comparison clock signal CLKC' and outputs the frequency and phase differences as the error signals UP and DN to the charge pump 44. For this purpose, the demodulator 102 may be incorporated into the feedback divider 54. In the case where the small-size SSCG illustrated in example FIG. 5 adopts a modulation method for changing a phase as described above, the demodulator 102 functions to compensate for the phase variation.

In accordance with embodiments, the demodulator 112 illustrated in example FIG. 6 compensates for the frequency variation of the oscillation clock signal CLKO received from the VCO 50 by as much as a modulation magnitude corresponding to the demodulation magnitude received from the demodulation controller 110 and outputs the compensation result CLKO' to the feedback divider 54. The feedback divider 54 divides the oscillation clock signal CLKO' received from the demodulator 112 and outputs the division result as the comparison clock signal CLKC to the phase frequency detector 42. In this case, the demodulator 112 may be incorporated into the VCO 50.

Figure 7A:
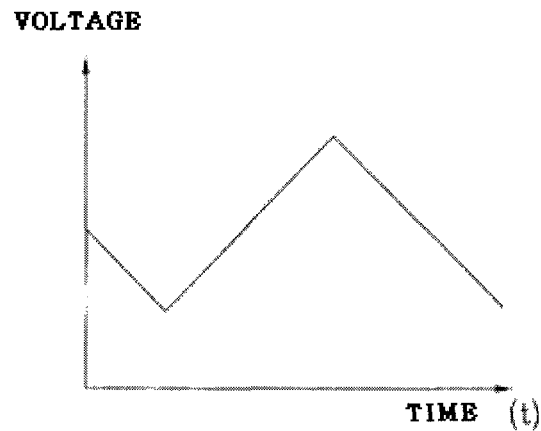

Example FIG. 7A is a graph illustrating an internal voltage of the loop filter 46 illustrated in example FIGS. 2 to 6. The horizontal axis represents time and the vertical axis represents voltage.

Figure 7B:
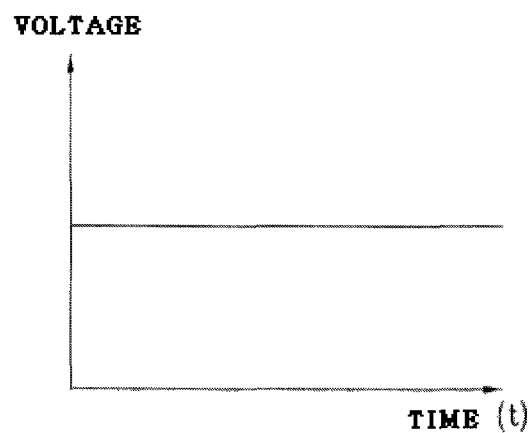

Example FIG. 7B is a graph illustrating an output of the loop filter 46 illustrated in example FIGS. 2 to 6, meaning, an input of the modulator 48. The horizontal axis represents time and the vertical axis represents voltage.

Figure 7C:
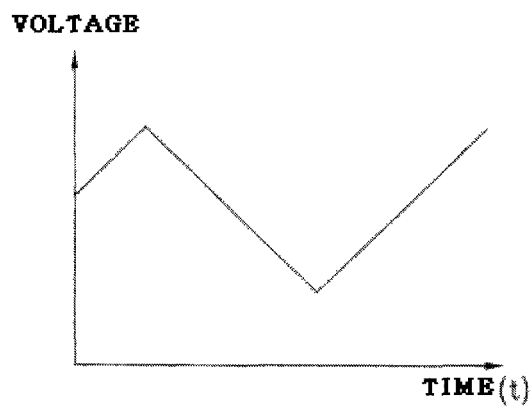

Example FIG. 7C is a graph illustrating an output of the modulator 48 illustrated in example FIGS. 2 to 6, meaning, an input of the VCO 50. The horizontal axis represents time and the vertical axis represents voltage.

Generally, the bandwidth of the PLL may not be sufficiently small relative to a frequency oscillated according to the sum of a modulation voltage generated from the modulation controller 22 and a controlled voltage generated from the loop filter 16. Typically, the bandwidth of the PLL is ⅒ of that of the modulation frequency. As a high frequency component is filtered in the loop filter 16 due to the bandwidth of the PLL, an oscillation clock signal oscillated by the VCO 20 may be distorted.

In accordance with embodiments, to avert this problem, the capacitance of a capacitor in the loop filter 16 should be increased to or above several nF. In this context, the small-size SSCGs in accordance with embodiments compensate for the modulation of a controlled signal generated from the loop filter 46 by additionally using the demodulation controllers 70, 80, 90, 100 and 110 and the demodulators 72, 82, 92, 102 and 112.

As illustrated in example FIG. 7B, the controlled voltage CV output from the loop filter 46 has only a Direct Current (DC) component independent of the modulation frequency. As illustrated in example FIG. 7C, only the input voltage of the VCO 50 that is generated to oscillate the frequency of the VCO 50 is modulated. Because the small-size SSCGs in accordance with embodiments include the loop filter 46 independent of a modulation frequency, they can generate an oscillation clock signal, while overcoming the problem of limiting the bandwidth of the PLL.

The PLLs illustrated in example FIGS. 2 to 6 are feedback circuits as they are. Hence, each of the demodulators 72, 82, 92, 102 and 112 may be disposed between components or within a component as illustrated in example FIGS. 2 to 6.

A description will now be made of a method for generating a small-size spread spectrum clock signal according to an exemplary embodiment of the present invention.

The pre-divider 40 first generates a reference clock signal CLKR by dividing an external clock signal CLKI. Each of the PLLs illustrated in example FIGS. 2 to 6 detects frequency and phase differences between the reference clock signal CLKR and a comparison clock signal CLKC as error signals, modulates a controlled voltage generated according to current that is produced in correspondence with the error signals by as much as a modulation magnitude, determines an oscillation clock signal having a frequency oscillated according to the modulated controlled voltage as a spectrum-spread version of the external clock signal CLKI, and generates the comparison clock signal CLKC by dividing the oscillation clock signal.

The PLL includes the phase frequency detector 42, the charge pump 44, the loop filter 46, the modulator 48, the VCO 50, and the feedback divider 54. Then the demodulation controllers 70, 80, 90, 100 and 110 and the demodulators 72, 82, 92, 102 and 112 compensate for the modulation of the controlled voltage according to a demodulation magnitude corresponding to the modulation magnitude. The modulation magnitude is generated from the modulation controller 52 according to an external modulation control signal. The demodulators 72, 82, 92, 102 and 112 compensate for the modulation as follows.

The demodulator 72 compensates for the phase variation of the reference clock signal CLKR resulting from the division of the external clock signal CLKI by as much as a modulation magnitude corresponding to a demodulation magnitude. Or the demodulator 82 compensates for the pulse width of the error signals UP and DN by as much as a modulation magnitude corresponding to a demodulation magnitude. Or the demodulator 92 compensates for the magnitude of the current received from the charge pump 44 by as much as a modulation magnitude corresponding to a demodulation magnitude. Or the demodulator 102 compensates for the phase variation of the comparison clock signal CLKC resulting from the division of the oscillation clock signal CLKO by as much as a modulation magnitude corresponding to a demodulation magnitude. Or the demodulator 112 compensates for the frequency variation of an oscillation clock signal CLKO by as much as a modulation magnitude corresponding to a demodulation magnitude.

As is apparent from the above description, the apparatus and method for generating a small-size spread spectrum clock signal in accordance with embodiments can overcome the limit of the bandwidth of a PLL dependent on a modulation frequency by additional use of a demodulator for compensating for a modulation magnitude and a modulation controller, thereby obviating the need for the requirement of a large-capacity capacitor in a loop filter. Compared to a general SSCG using an external filter, an internal filter can be used. The resulting cost saving from avoiding the use of an external filter improves cost competitiveness.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
a pre-divider which generates a reference clock signal by dividing an external clock signal;
a phase frequency detector which detects frequency and phase differences between the reference clock signal and a comparison clock signal and outputs the detected frequency and phase differences as error signals;
a charge pump which outputs current in accordance with the error signals;
a loop filter which outputs a controlled voltage corresponding to the current received from the charge pump;
a modulation controller which generates a modulation magnitude in accordance with a modulation control signal;
a modulator which modulates the controlled voltage in accordance with the modulation magnitude;
a voltage controlled oscillator which outputs an oscillation clock signal having a frequency oscillated in accordance with the modulated controlled voltage as a spectrum-spread version of the external clock signal;
a feedback divider which generates the comparison clock signal by dividing the oscillation clock signal;
a demodulation controller which generates a demodulation magnitude for use in compensating for the modulation magnitude; and
a demodulator which compensates for the modulation of the controlled voltage output from the loop filter in accordance with the demodulation magnitude.

2. The apparatus of claim 1, wherein the demodulator compensates for a phase variation of the reference clock signal generated from the pre-divider by as much as the modulation magnitude according to the demodulation magnitude and outputs the compensated reference clock signal to the phase frequency detector.

3. The apparatus of claim 1, wherein the demodulator compensates for a pulse width of the error signals by as much as the modulation magnitude according to the demodulation magnitude and outputs the compensated error signals to the charge pump.

4. The apparatus of claim 1, wherein the demodulator compensates for a magnitude of the current by as much as the modulation magnitude according to the demodulation magnitude and outputs the compensated current to the loop filter.

5. The apparatus of claim 1, wherein the demodulator compensates for a phase variation of the comparison clock signal generated from the feedback divider by as much as the modulation magnitude according to the demodulation magnitude and outputs the compensated comparison clock signal to the phase frequency detector.

6. The apparatus of claim 1, wherein the demodulator compensates for a phase variation of the oscillation clock signal by as much as the modulation magnitude according to the demodulation magnitude and outputs the compensated comparison clock signal to the feedback divider.

7. The apparatus of claim 2, wherein the demodulator is included in the pre-divider.

8. The apparatus of claim 3, wherein the demodulator is included in the phase frequency detector.

9. The apparatus of claim 4, wherein the demodulator is included in the charge pump.

10. The apparatus of claim 5, wherein the demodulator is included in the feedback divider.

11. The apparatus of claim 6, wherein the demodulator is included in the voltage controlled oscillator.

12. A method comprising:
generating a reference clock signal by dividing an external clock signal;
detecting frequency and phase differences between the reference clock signal and a comparison clock signal as error signals, modulating a controlled voltage corresponding to a current in accordance with a modulation control signal, outputting an oscillation clock signal having a frequency oscillated according to the modulated controlled voltage as a spectrum-spread version of the external clock signal, and generating the comparison clock signal by dividing the oscillation clock signal; and then
compensating for the modulation of the controlled voltage in accordance with a demodulation magnitude that is generated for use in compensating for a modulation magnitude.

13. The method of claim 12, wherein the modulation magnitude is generated in accordance with an external modulation control signal.

14. The method of claim 12, wherein compensating for the modulation of the controlled voltage comprises compensating for a phase variation of the reference clock signal by as much as the modulation magnitude in accordance with the demodulation magnitude.

15. The method of claim 12, wherein compensating for the modulation of the controlled voltage comprises compensating for a pulse width of the error signals by as much as the modulation magnitude in accordance with the demodulation magnitude.

16. The method of claim 12, wherein compensating for the modulation of the controlled voltage comprises compensating for a magnitude of the current by as much as the modulation magnitude in accordance with the demodulation magnitude.

17. The method of claim 12, wherein the compensation comprises compensating for a phase variation of the comparison clock signal by as much as the modulation magnitude in accordance with the demodulation magnitude.

18. The method of claim 12, wherein the compensation comprises compensating for a phase variation of the oscillation clock signal by as much as the modulation magnitude in accordance with the demodulation magnitude.

19. A method comprising:
generating a reference clock signal by dividing an external clock signal;
detecting frequency and phase differences between the reference clock signal and a comparison clock signal and then outputting the detected frequency and phase differences as error signals;

outputting current in accordance with the error signals;

outputting a controlled voltage corresponding to the current;

generating a modulation magnitude in accordance with a modulation control signal;

modulating the controlled voltage in accordance with the modulation magnitude;

outputting an oscillation clock signal having a frequency oscillated in accordance with the modulated controlled voltage as a spectrum-spread version of the external clock signal;

generating the comparison clock signal by dividing the oscillation clock signal;

generating a demodulation magnitude for use in compensating for the modulation magnitude; and then compensating for the modulation of the controlled voltage in accordance with the demodulation magnitude.

20. The method of claim 19, wherein the modulation magnitude is generated in accordance with an external modulation control signal.

* * * * *